United States Patent
Freitag et al.

(10) Patent No.: US 7,773,348 B2
(45) Date of Patent: Aug. 10, 2010

(54) HIGH COERCIVITY HARD MAGNETIC SEEDLAYER

(75) Inventors: James Mac Freitag, Sunnyvale, CA (US); Mustafa Michael Pinarbasi, Morgan Hill, CA (US)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 1196 days.

(21) Appl. No.: 11/366,099

(22) Filed: Mar. 2, 2006

(65) Prior Publication Data

US 2007/0206335 A1 Sep. 6, 2007

(51) Int. Cl.
G11B 5/127 (2006.01)
(52) U.S. Cl. .................................. 360/324.12
(58) Field of Classification Search ............ 360/324.12, 360/324, 324.11, 324.1, 324.2, 324.21
See application file for complete search history.

(56) References Cited

U.S. PATENT DOCUMENTS

| | | | | |
|---|---|---|---|---|
| 5,130,867 A | * | 7/1992 | Ohashi | 360/75 |
| 5,169,703 A | * | 12/1992 | Miyazaki et al. | 428/141 |
| 5,364,698 A | * | 11/1994 | Kotani | 428/323 |
| 5,500,296 A | * | 3/1996 | Inoue et al. | 428/408 |
| 5,883,764 A | * | 3/1999 | Pinarbasi | 360/322 |
| 5,887,336 A | * | 3/1999 | Watanabe | 29/603.16 |
| 6,087,004 A | * | 7/2000 | Tanaka et al. | 428/403 |
| 6,146,740 A | * | 11/2000 | Birukawa et al. | 428/141 |
| 6,219,207 B1 | * | 4/2001 | Pinarbasi | 360/322 |
| 6,636,400 B2 | * | 10/2003 | Pinarbasi et al. | 360/324.12 |
| 6,816,347 B2 | * | 11/2004 | Koi et al. | 360/324.11 |
| 7,397,640 B2 | * | 7/2008 | Pinarbasi | 360/324.12 |
| 7,428,129 B2 | * | 9/2008 | Pinarbasi | 360/324.12 |
| 7,502,209 B2 | * | 3/2009 | Freitag et al. | 360/324.12 |
| 2001/0013999 A1 | * | 8/2001 | Koi et al. | 360/324.11 |
| 2003/0030947 A1 | | 2/2003 | Ooshima | |
| 2003/0058586 A1 | * | 3/2003 | Pinarbasi et al. | 360/324.12 |
| 2005/0066514 A1 | | 3/2005 | Chau et al. | |
| 2005/0068696 A1 | | 3/2005 | Chau et al. | |
| 2006/0002041 A1 | * | 1/2006 | Pinarbasi | 360/324.12 |
| 2006/0012925 A1 | * | 1/2006 | Pinarbasi | 360/324.1 |
| 2006/0024531 A1 | * | 2/2006 | Murakami | 428/827 |
| 2006/0124585 A1 | * | 6/2006 | Suwa et al. | 216/22 |

* cited by examiner

*Primary Examiner*—Allen T Cao
(74) *Attorney, Agent, or Firm*—Patterson & Sheridan, L.L.P.

(57) ABSTRACT

Methods and apparatus provide improved properties of a hard bias layer of a magnetoresistance sensor. The properties of the hard bias layer are improved by using a multilayer seed structure that includes a chromium-containing layer disposed between two tungsten-containing layers.

18 Claims, 3 Drawing Sheets

HIGH COERCIVITY HARD MAGNETIC SEEDLAYER

BACKGROUND OF THE INVENTION

1. Field of the Invention

Embodiments of the invention generally relate to electronic data storage and retrieval systems having magnetic heads capable of reading recorded information stored on magnetic media.

2. Description of the Related Art

In an electronic data storage and retrieval system, a magnetic head typically includes a reader portion having a magnetoresistive (MR) sensor for retrieving magnetically-encoded information stored on a magnetic recording medium or disk. The MR sensor includes multiple layers and operates based on a change of electrical resistivity of certain materials of the MR sensor in the presence of a magnetic field. During a read operation, a bias current is passed through the MR sensor. Magnetic flux emanating from a surface of the recording medium causes rotation of a magnetzation vector of a sensing or free layer of the MR sensor, which in turn causes the change in electrical resistivity of the MR sensor. Since a voltage across the MR sensor is equal to the bias current that is supplied times the resistivity, the change in electrical resistivity of the MR sensor can be detected by measuring the voltage across the MR sensor to provide voltage information that external circuitry can then convert and manipulate as necessary.

A hard magnetic bias structure can be used to suppress magnetic domain wall movement of the free layer to provide a noise-free response from the MR sensor. In construction of the MR sensor, depositing hard bias layers on both sides of the layers forming the MR sensor accomplishes this suppression. In order to promote a desired texture of the hard bias layers, seedlayer structures can be deposited prior to the hard bias layers. The seedlayer structures can affect properties of the hard bias layers including, for example, coercivity and squareness.

Sufficient coercivity prevents disruption of a magnetic configuration of the hard bias layers due to external magnetic fields, such as from the magnetic recording medium. Additionally, the in-plane remnant magnetization ($M_r$) should be large enough to provide a longitudinal bias flux. If the $M_r$ of the hard bias layers is insufficient, longitudinal bias for the free layer falls short of supplying the necessary flux to ensure noise-free operation of the read head. This implies that the squareness ($M_r$/saturation magnetization ($M_s$)) of the hard bias layer along the in-plane direction should be high.

The ability of the seedlayer structure to provide the coercivity and squareness of the hard bias layers can depend on the surface onto which the seedlayer structure is deposited. The seedlayer structure can be deposited onto, for example, crystalline metals such as a platinum manganese (PtMn) layer of the MR sensor. Accordingly, selection of the seedlayer structure requires that the properties of the hard bias layers are not degraded when the seedlayer structure is deposited on the layers of the MR sensor exposed during the partial milling.

Therefore, there exists a need for seedlayer configurations that provide improved properties of hard bias layers of a magnetoresistance sensor.

SUMMARY OF THE INVENTION

According to one embodiment, a magnetoresistive (MR) read sensor includes hard magnetic layers disposed on both sides of a free layer within the MR read sensor and a multilayer seed structure supporting the hard magnetic layers. The seed structure can include one or more layers containing chromium, tungsten and silicon.

In another embodiment, a method of forming a MR read sensor includes depositing hard magnetic layers on both sides of a free layer within the MR read sensor and forming a seedlayer structure that supports the hard magnetic layers. Forming the seedlayer structure can include depositing two tungsten-containing layers with a chromium-containing layer between the tungsten-containing layers.

For still another embodiment, a MR read sensor includes hard magnetic means for aligning a free layer within the MR read sensor in a single domain state and a seed means for supporting the hard magnetic means and promoting a desired texture of the hard magnetic means. The seed means includes a chromium-containing layer disposed between two tungsten-containing layers.

According to another embodiment, a MR read sensor includes a free layer, hard magnetic layers disposed on both sides of the free layer, and a multilayer seed structure supporting the hard magnetic layers. The seed structure can include a buffer underlayer comprising silicon and chromoly, which disposed directly on and in contact with one or more metal layers within an MR element stack of the MR read sensor. Additionally, the seed structure can include a chromoly first layer, a tungsten second layer, a chromoly third layer and a tungsten fourth layer. The first through fourth layers can all be disposed on the buffer underlayer in order with the fourth layer defining an outermost layer of the seed structure in contact with the hard magnetic layers.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

In the following, reference is made to embodiments of the invention. However, it should be understood that the invention is not limited to specific described embodiments. Instead, any combination of the following features and elements, whether related to different embodiments or not, is contemplated to implement and practice the invention. Furthermore, in various embodiments the invention provides numerous advantages over the prior art. However, although embodiments of the invention may achieve advantages over other possible solutions and/or over the prior art, whether or not a particular advantage is achieved by a given embodiment is not limiting of the invention. Thus, the following aspects, features, embodiments and advantages are merely illustrative and, unless explicitly present, are not considered elements or limitations of the appended claims.

Figure 1:
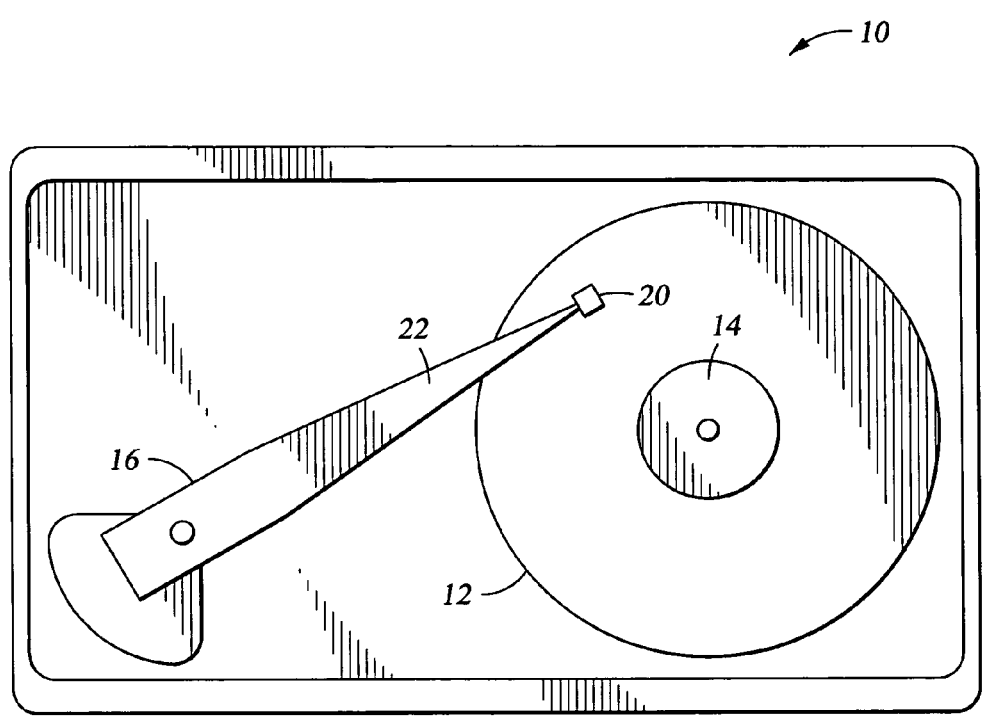
FIG. 1 is a top plan view of a hard disk drive including a magnetic head, according to embodiments of the invention.

FIG. 1 illustrates a hard disk drive 10 that includes a magnetic media hard disk 12 mounted upon a motorized spindle 14. An actuator arm 16 is pivotally mounted within the hard disk drive 10 with a magnetic head 20 disposed upon a distal end 22 of the actuator arm 16. During operation of the hard disk drive 10, the hard disk 12 rotates upon the spindle 14 and the magnetic head 20 acts as an air bearing slider adapted for flying above the surface of the disk 12. As described hereinafter, the magnetic head 20 includes a substrate base upon which various layers and structures that form the magnetic head 20 are fabricated. Thus, magnetic heads disclosed herein can be fabricated in large quantities upon a substrate and subsequently sliced into discrete magnetic heads for use in devices such as the hard drive 10.

Figure 2:
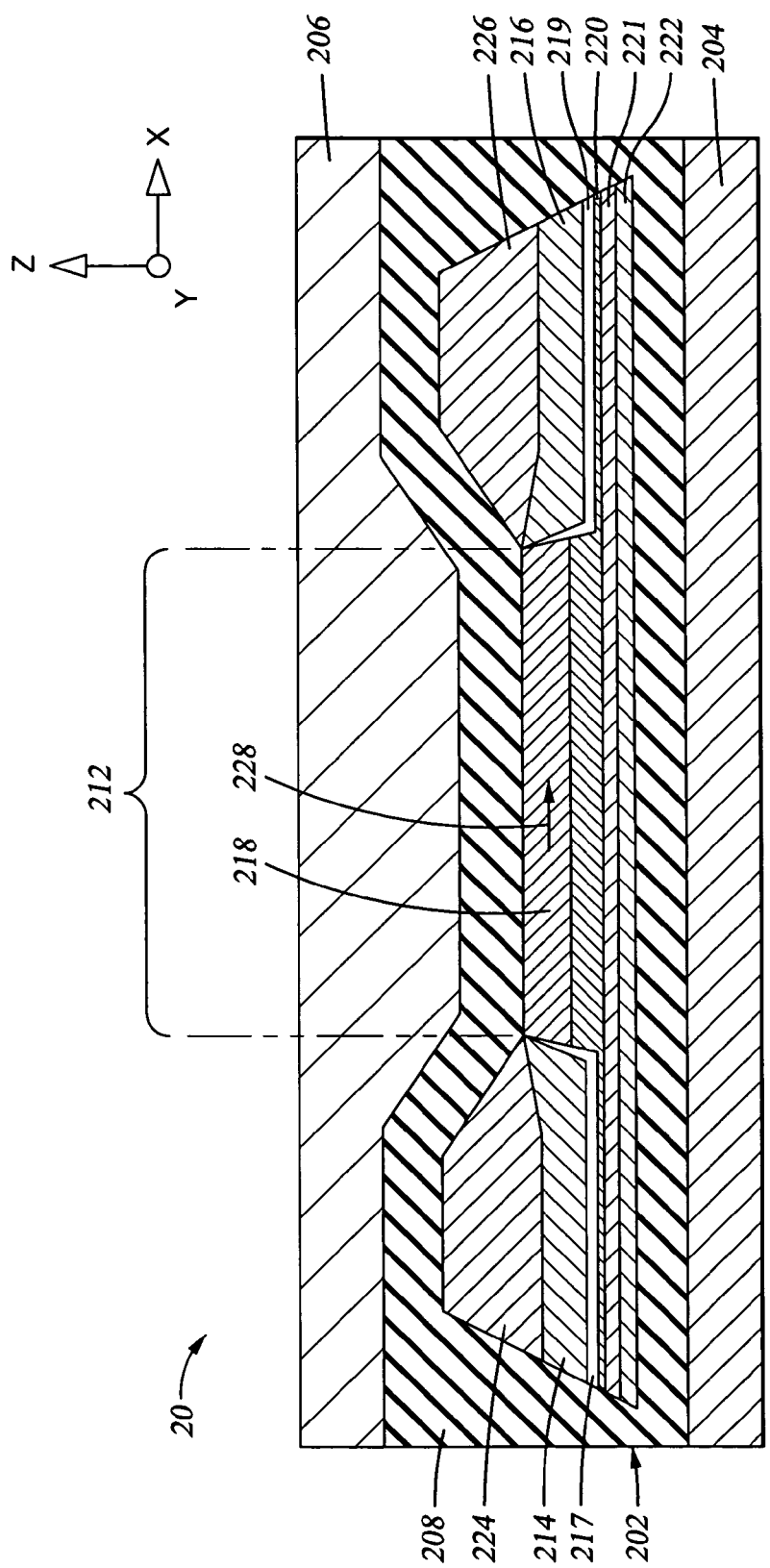
FIG. 2 is a cross-sectional, diagrammatic air bearing surface view of the magnetic head having a seedlayer structure for hard magnetic bias layers, according to embodiments of the invention.

FIG. 2 shows a layered schematic diagram of a read portion of the magnetic head 20, according to one embodiment of the invention. The magnetic head 20 includes a read sensor 202 separated from a bottom shield 204 and a top shield 206 by an insulating dielectric 208. The insulating dielectric 208 is preferably a non-magnetic and non-conducting material, such as alumina ($Al_2O_3$). For some embodiments, the read sensor 202 is a giant magnetoresistive (GMR) sensor having a plurality of alternating magnetic and nonmagnetic layers (hereinafter "MR element stack").

For example, the MR element stack can include an antiferromagnetic layer 222, a ferromagnetic pinned layer 221, a spacer layer 220 (e.g., copper), a ferromagnetic sensing or free layer 218, and first and second hard bias seedlayer structures 217, 219. The hard bias seedlayer structures 217, 219 are illustrated as a box representing any of the embodiments disclosed herein. First and second hard magnetic bias layers 214, 216 provide a longitudinal magnetic bias in a direction X to align the ferromagnetic free layer 218 in a single domain state. On the hard magnetic bias layers 214, 216 are disposed first and second electrode layers 224, 226 spaced apart and made of a nonmagnetic, electrically conductive material having relatively low electric resistance. The electrical connections to the electrode layers 224, 226 are made behind the ABS which is not shown in FIG. 2. An active region 212 of the read sensor 202 is located between the electrode layers 224, 226.

Figure 3:
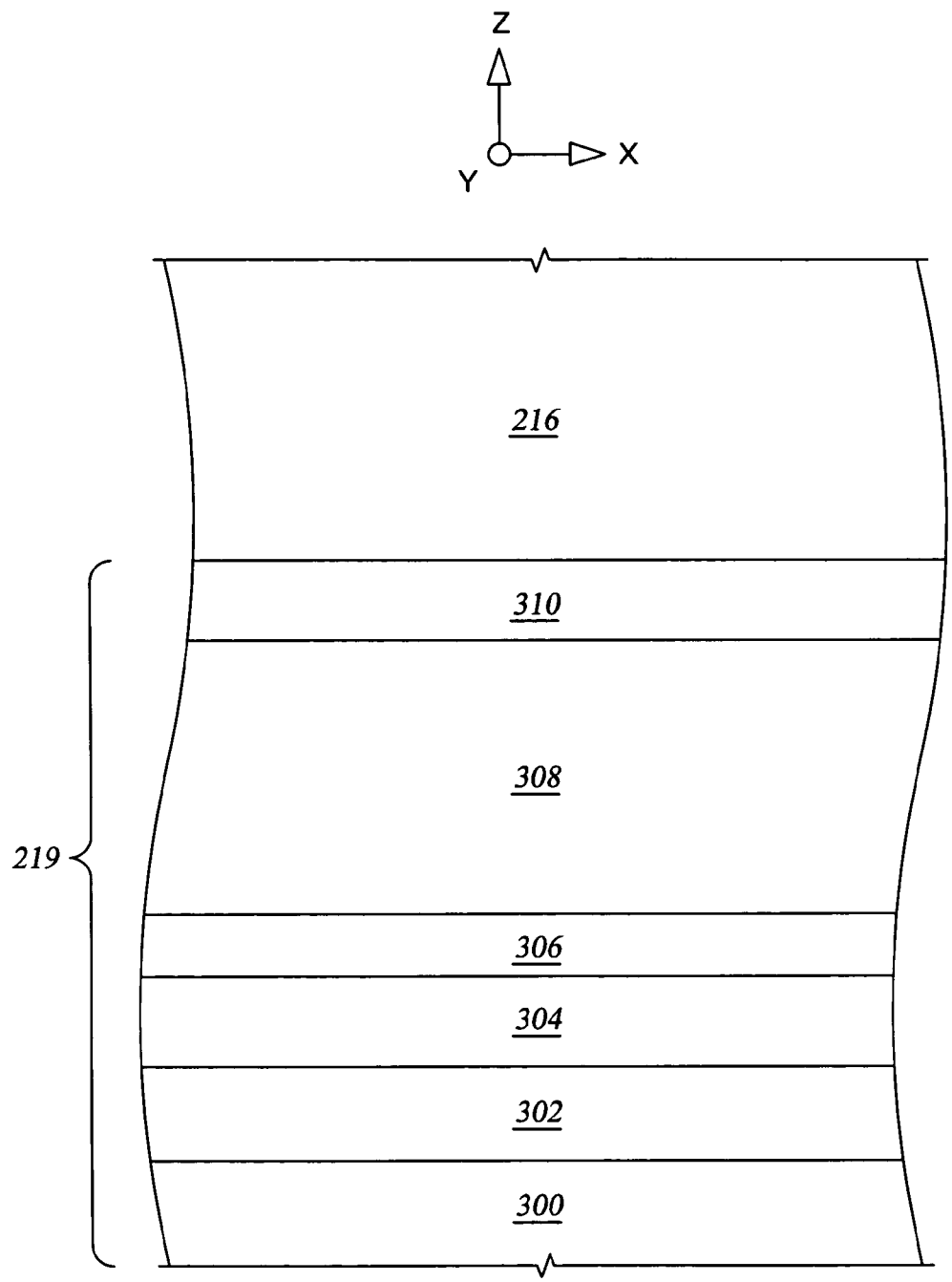
FIG. 3 is an enlarged schematic of a plurality of layers providing the seedlayer structure.

FIG. 3 illustrates an enlarged schematic of a plurality of layers providing the seedlayer structure 219 (which is analogous to the first hard bias seedlayer structure 217 that is not separately described herein), according to one embodiment of the invention. The seed layer structure 219 includes a chromium molybdenum alloy (CrMo or chromoly) first layer 300, a silicon (Si) second layer 302, a chromoly third layer 304, a tungsten (W) fourth layer 306, a chromoly fifth layer 308, and a tungsten sixth layer 310. The chromoly first layer 300 together with the Si second layer 302 can be deposited directly on and in contact with one or more of the layers within the MR element stack as a buffer layer such that the seedlayer structure 219 can still impart improved coercivity of the hard bias layers 214, 216 while at least maintaining squareness of the hard bias layers 214, 216. For example, a majority of the chromoly first layer 300 and Si second layer 302 can be deposited on the antiferromagnetic layer 222, which can include a platinum manganese (PtMn) alloy. The tungsten sixth layer 310 defines a final outermost layer of the seed layer structure 219 for subsequent deposition of one of the hard bias layer 216 directly on and in contact therewith.

For some embodiments, the chromoly first layer 300, the silicon second layer 302 and the chromoly third layer 304 are each between 5.0 angstroms (Å) and 20.0 Å thick. The tungsten fourth layer 306 can be between 3.0 Å and 20.0 Å thick while the chromoly fifth layer 308 can have a thickness between 30.0 Å and 200.0 Å. Further, the tungsten sixth layer 310 can be between 3.0 Å and 20.0 Å in thickness.

The hard bias layers 214, 216 can include a cobalt platinum (CoPt) alloy. Other cobalt alloys or cobalt platinum alloys can be used as the hard bias layers 214, 216 for deposition on the seed layer structures 217, 219 of the invention. Additionally, the seed layer structures 217, 219 can improve properties of other materials selected for the hard bias layers 214, 216 such as when the hard bias layers 214, 216 are formed from ternary alloys, e.g., cobalt platinum chromium (CoPtCr).

Table 1 shows coercivity ($H_c$) and squareness (remnant magnetization/saturation magnetization; $M_r/M_s$) of a hard bias layer of CoPt using a seed layer structure with various configurations provided in Examples 1 through 4. The seed layer structures were deposited on a PtMn base layer having a thickness of 100.0 Å. A ten second etch was performed prior to depositing the seed layer structures. Table 1 identifies the configuration downward in order of deposition such that the seed layer structure provided an intermediate between the PtMn base layer and the CoPt that was capped with a layer of Rh having a thickness of 20 Å. For a first comparative example, the coercivity and squareness of hard bias layers on PtMn or on other MR element stack layers are approximately 500 oersted (Oe) and 0.8, respectively, with chromium seedlayer structures. In a second comparative example, the coercivity of hard bias layers on PtMn or on other MR element stack layers is approximately 2200 Oe with a seedlayer structure having three layers that are respectively CrMo, Si, and CrMo. In Table 1 for Structure 1, adding a layer of W does not substantially improve the coercivity; however, Structure 2 provides at least about a 15% improvement in coercivity over all the other examples with negligible negative effects on squareness.

TABLE 1

|  | Structure 1 | Structure 2 |
| --- | --- | --- |
| PtMn | ~100 Å | ~100 Å |
| CrMo | 10 Å | 10 Å |
| Si | 10 Å | 10 Å |
| CrMo | 60 Å | 10 Å |
| W | 5 Å | 5 Å |
| CrMo | — | 60 Å |
| W | — | 10 Å |
| $H_c$ | 2280 Oe | 2515 Oe |
| squareness | 0.81 | 0.79 |

A method of forming the magnetic head 20 includes forming the MR element stack with the seed layer structures 217, 219. The method includes forming the antiferromagnetic layer 222 and forming the ferromagnetic pinned layer 221 that has a magnetic moment in a direction Y oriented ninety degrees from a magnetic moment 228 of the free layer 218 that is in a direction X. Additionally, depositing a non-magnetic material forms the spacer layer 220. Depositing a ferromagnetic material over the spacer layer 220 provides the free layer 218. Next, selective ion milling, such as via use of a photomask formed over the MR element stack, can remove part of at least one of the free layer 218, spacer layer 220, pinned layer 221 and antiferromagnetic layer 222. Ion beam sputtering can deposit the hard bias seedlayer structures 217, 219 that include three distinct layers that respectively include tungsten, chromium, and tungsten. For some embodiments, deposition of the hard bias seedlayer structures 217, 219 includes ion beam sputtering the first through sixth layers 300-310, in order, prior to depositing the hard bias layers 214, 216 on both sides of the free layer 218.

Methods and apparatus provide improved properties of the hard bias layers 214, 216 of the read sensor 202. Using the seedlayer structures 217, 219 that include two tungsten-containing layers separated from one another by a chromium-containing layer, the coercivity of the hard bias layers 214, 216 is high and prevents disruption of a magnetic configuration of the hard bias layers 214, 216. Further, the seedlayer structures 217, 219 maintain this high coercivity of the hard bias layers 214, 216 with negligible negative effects on squareness of the hard bias layers 214, 216 even when the seedlayer structures 217, 219 are deposited on a metal layer such as PtMn.

A buffer underlayer, such as CrMo and Si layers, is used to separate a ferromagnetic underlayer, which can remain after partial removal of sensor layers, from a hard bias stack to achieve high coercivity. Additional W and CrMo seed layers deposited on the buffer underlayer further separate the ferromagnetic underlayer and the hard bias stack. These additional W and CrMo seed layers enhance the coercivity of the hard bias stack while retaining desired squareness.

While the foregoing is directed to embodiments of the present invention, other and further embodiments of the invention may be devised without departing from the basic scope thereof, and the scope thereof is determined by the claims that follow.

What is claimed is:

1. A magnetoresistive (MR) read sensor, comprising:
    hard magnetic layers disposed on both sides of a free layer within the MR read sensor; and
    a multilayer seed structure supporting the hard magnetic layers, wherein the seed structure comprises one or more layers containing chromium, tungsten and silicon, the one or more layers comprising a chromium-containing first layer, a tungsten-containing second layer, a chromium-containing third layer and a tungsten-containing fourth layer.

2. The MR read sensor of claim 1, wherein the chromium-containing first layer, the tungsten-containing second layer, the chromium-containing third layer and the tungsten-containing fourth layer are arranged in order.

3. The MR read sensor of claim 1, wherein the chromium-containing first layer, the tungsten-containing second layer, the chromium-containing third layer and the tungsten-containing fourth layer are all deposited onto a buffer underlayer comprising silicon and chromium.

4. The MR read sensor of claim 3, wherein the buffer underlayer comprises a silicon-containing buffer layer and a chromium-containing buffer layer.

5. The MR read sensor of claim 3, wherein the buffer underlayer comprises a silicon buffer layer and a chromium molybdenum alloy buffer layer.

6. The MR read sensor of claim 3, wherein the second and fourth layers are substantially tungsten.

7. The MR read sensor of claim 3, wherein the first and third layers comprise a chromium molybdenum alloy.

8. The MR read sensor of claim 7, wherein the buffer underlayer comprises a silicon buffer layer and a chromium molybdenum alloy buffer layer.

9. The MR read sensor of claim 8, wherein the buffer underlayer is deposited directly on and in contact with one or more metal layers within an MR element stack of the MR read sensor.

10. The MR read sensor of claim 8, wherein the chromium molybdenum alloy buffer layer, the silicon buffer layer, and the chromium-containing first layer are each between 5.0 angstroms (Å) and 20.0 Å thick, the tungsten-containing second layer is between 3.0 Å and 20.0 Å thick, the chromium-containing third layer is between 30.0 Å and 200.0 Å, and the tungsten-containing fourth layer is between 3.0 Å and 20.0 Å in thickness.

11. The MR read sensor of claim 8, wherein the chromium molybdenum alloy buffer layer, the silicon buffer layer, and the chromium-containing first layer are deposited in order and are each about 10.0 angstroms (Å) thick, the tungsten-containing second layer is deposited on the chromium-containing first layer and is about 5.0 Å thick, the chromium-containing third layer is deposited on the tungsten-containing second layer and is about 60.0 Å, and the tungsten-containing fourth layer is deposited on the chromium-containing third layer and is about 10 Å thick.

12. The MR read sensor of claim 11, wherein the hard magnetic layers comprise a cobalt platinum alloy.

13. The MR read sensor of claim 3, wherein the tungsten-containing fourth layer defines an outermost layer of the seed structure and directly contacts the hard magnetic layer.

14. The MR read sensor of claim 3, wherein the first through fourth layers are disposed onto one another in order.

15. The MR read sensor of claim 3, wherein the first through fourth layers are disposed onto one another in order with the tungsten-containing fourth layer defining an outermost layer of the seed structure in contact with the hard magnetic layer.

16. The MR read sensor of claim 1, wherein the hard magnetic layers comprise a cobalt platinum alloy.

17. The MR read sensor of claim 1, further comprising:
    a pinned layer selected from a ferromagnetic pinned layer and an anti-ferromagnetically coupled pinned layer;
    a nonmagnetic spacer layer between the free layer and the pinned layer; and
    an antiferromagnetic pinning layer coupled to the pinned layer for pinning a magnetic moment of the pinned layer.

18. A magnetoresistive (MR) read sensor, comprising:
    a free layer;
    hard magnetic layers disposed on both sides of the free layer; and
    a multilayer seed structure supporting the hard magnetic layers, wherein the seed structure comprises:
        a buffer underlayer comprising silicon and chromoly, wherein the buffer underlayer is disposed directly on and in contact with one or more metal layers within an MR element stack of the MR read sensor;
        a chromoly first layer;
        a tungsten second layer;
        a chromoly third layer; and
        a tungsten fourth layer, wherein the first through fourth layers are all disposed on the buffer underlayer in order with the fourth layer defining an outermost layer of the seed structure in contact with the hard magnetic layers.

* * * * *